(12) United States Patent
Han et al.

(10) Patent No.: US 12,520,690 B2
(45) Date of Patent: Jan. 6, 2026

(54) DISPLAY APPARATUS, AND METHOD FOR MANUFACTURING COVER PLATE OF DISPLAY APPARATUS

(71) Applicant: BOE TECHNOLOGY GROUP CO., LTD., Beijing (CN)

(72) Inventors: Ying Han, Beijing (CN); Ling Wang, Beijing (CN); Pan Xu, Beijing (CN); Yicheng Lin, Beijing (CN); Zhan Gao, Beijing (CN); Guoying Wang, Beijing (CN); Xing Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 932 days.

(21) Appl. No.: 17/770,595

(22) PCT Filed: Mar. 9, 2021

(86) PCT No.: PCT/CN2021/079800
§ 371 (c)(1),
(2) Date: Apr. 20, 2022

(87) PCT Pub. No.: WO2021/196995
PCT Pub. Date: Oct. 7, 2021

(65) Prior Publication Data
US 2022/0399530 A1 Dec. 15, 2022

(30) Foreign Application Priority Data
Apr. 2, 2020 (CN) .......................... 202010256762.3

(51) Int. Cl.
*H10K 59/35* (2023.01)
*H10K 59/38* (2023.01)
(Continued)

(52) U.S. Cl.
CPC ......... *H10K 59/352* (2023.02); *H10K 59/353* (2023.02); *H10K 59/38* (2023.02);
(Continued)

(58) Field of Classification Search
CPC .... H10K 59/352; H10K 59/353; H10K 71/00; H10K 59/873; H10K 59/38;
(Continued)

(56) References Cited

U.S. PATENT DOCUMENTS

| 2015/0048348 A1 | 2/2015 | Huang et al. |
| 2015/0185381 A1 | 7/2015 | Wu et al. |

(Continued)

FOREIGN PATENT DOCUMENTS

| CN | 104377226 A | 2/2015 |
| CN | 106707607 A | 5/2017 |

(Continued)

OTHER PUBLICATIONS

First Office Action issued by Chinese Patent Office for the Application No. 202010256762.3 on Jun. 25, 2021.
(Continued)

*Primary Examiner* — James R Greece
*Assistant Examiner* — Hana S Featherly
(74) *Attorney, Agent, or Firm* — XSENSUS LLP (57) ABSTRACT

A display apparatus includes a cover plate and a display substrate. The cover plate includes a first base substrate, a black matrix and a support layer stacked on a side of the first base substrate, and a quantum dot layer disposed on the side of the first base substrate. The black matrix and the support layer each have a plurality of openings to form a plurality of opening regions. The quantum dot layer includes a plurality of quantum dot units. Each quantum dot unit is located in an opening region in the plurality of opening regions. The display substrate includes a second base substrate, driving
(Continued)

circuit structures disposed on a side of the second base substrate, and light-emitting devices disposed on a side of the driving circuit structures. Each light-emitting device is coupled to a driving circuit structure in the driving circuit structures to emit light.

19 Claims, 8 Drawing Sheets

(51) Int. Cl.
  *H10K 59/80* (2023.01)
  *H10K 59/12* (2023.01)
  *H10K 102/10* (2023.01)

(52) U.S. Cl.
  CPC ......... *H10K 59/873* (2023.02); *H10K 59/878* (2023.02); *H10K 59/8792* (2023.02); *H10K 59/12* (2023.02); *H10K 2102/102* (2023.02); *H10K 2102/103* (2023.02)

(58) Field of Classification Search
  CPC .. H10K 50/865; H10K 59/878; H10K 50/856; H10K 50/844; H10K 59/8792; H10K 2102/102; H10K 2102/103; H10K 59/12
  USPC .......................................................... 313/501
  See application file for complete search history.

(56) References Cited

U.S. PATENT DOCUMENTS

| | | | |
|---|---|---|---|
| 2018/0190625 A1* | 7/2018 | Steckel | ................ H10H 20/856 |
| 2019/0157354 A1 | 5/2019 | Lee et al. | |
| 2019/0339574 A1 | 11/2019 | Lin et al. | |
| 2020/0073167 A1 | 3/2020 | Shi et al. | |
| 2020/0343315 A1 | 10/2020 | Lin et al. | |
| 2021/0033761 A1 | 2/2021 | Song et al. | |

FOREIGN PATENT DOCUMENTS

| | | |
|---|---|---|
| CN | 108345142 A | 7/2018 |
| CN | 108873465 A | 11/2018 |
| CN | 108922914 A | 11/2018 |
| CN | 109375410 A | 2/2019 |
| CN | 109491136 A | 3/2019 |
| CN | 110618555 A | 12/2019 |
| CN | 111416048 A | 7/2020 |
| CN | 111863874 A | 10/2020 |

OTHER PUBLICATIONS

Second Office Action issued by Chinese Patent Office for the Application No. 202010256762.3 on Feb. 24, 2022.
Notification to Grant patent Right for Invention issued by Chinese Patent Office for Application No. 202010256762.3 on Jun. 6, 2022.

* cited by examiner

DISPLAY APPARATUS, AND METHOD FOR MANUFACTURING COVER PLATE OF DISPLAY APPARATUS

CROSS-REFERENCE TO RELATED APPLICATIONS

This application is a national phase entry under 35 USC 371 of International Patent Application No. PCT/CN 2021/079800 filed on Mar. 9, 2021, which claims priority to Chinese Patent Application No. 202010256762.3, filed on Apr. 2, 2020, which are incorporated herein by reference in their entirety.

TECHNICAL FIELD

The present disclosure relates to the field of display technologies, and in particular, to a display apparatus, and a method for manufacturing a cover plate of a display apparatus.

BACKGROUND

With the continuous development of display technologies, a display apparatus is able to realize wide color gamut display. A quantum dot (QD) display apparatus has characteristics of narrow spectrum, high color purity and wide color gamut, and has unique advantages in the field of wide color gamut display.

SUMMARY

In an aspect, a display apparatus is provided. The display apparatus includes a cover plate and a display substrate arranged opposite to the cover plate. The cover plate includes a first base substrate, a black matrix and a support layer that are stacked on a side of the first base substrate proximate to the display substrate, and a quantum dot layer disposed on the side of the first base substrate proximate to the display substrate. The black matrix and the support layer each have a plurality of openings, and the plurality of openings of the black matrix are at least partially overlapped with the plurality of openings of the support layer, respectively, so as to form a plurality of opening regions. The quantum dot layer includes a plurality of quantum dot units, and each quantum dot unit is located in an opening region in the plurality of opening regions. The display substrate includes a second base substrate, driving circuit structures disposed on a side of the second base substrate proximate to the cover plate, and light-emitting devices disposed on a side of the driving circuit structures away from the second base substrate. Each light-emitting device is coupled to a driving circuit structure in the driving circuit structures, and the light-emitting device is configured to emit light under a drive of the driving circuit structure.

In some embodiments, the black matrix is farther from the first base substrate than the support layer.

In some embodiments, the support layer has a main surface away from the first base substrate and slope surfaces each for forming a respective opening of the support layer by enclosing. The cover plate further includes a light reflection layer, and the light reflection layer at least covers the slope surfaces of the support layer.

In some embodiments, an edge of an orthogonal projection of an opening of the black matrix on the first base substrate coincides with one of an inner edge and an outer edge of an orthographic projection of a slope surface, opposite to the opening of the black matrix, of the support layer on the first base substrate. The inner edge is an edge of the orthographic projection of the slope surface proximate to a center of an opening enclosed by the slope surface. The outer edge is an edge of the orthographic projection of the slope surface away from the center of the opening enclosed by the slope surface.

In some embodiments, a material of the light reflection layer includes a metal material.

In some embodiments, the light reflection layer is of a stacked-layer structure formed by stacking a transparent metal oxide layer, a light reflection metal layer and another transparent metal oxide layer sequentially, or a stacked-layer structure formed by stacking at least two metal layers.

In some embodiments, the stacked-layer structure formed by stacking the transparent metal oxide layer, the light reflection metal layer and the another transparent metal oxide layer sequentially is a stacked-layer structure formed by stacking an indium tin oxide layer, a silver layer and another indium tin oxide layer sequentially, or the stacked-layer structure formed by stacking the at least two metal layers is a stacked-layer structure formed by stacking a molybdenum layer, an aluminum layer and a nickel layer sequentially.

In some embodiments, a thickness of the light reflection layer is in a range of 100 nm to 300 nm.

In some embodiments, an edge of an orthographic projection of the quantum dot unit on the first base substrate is located between an inner edge and an outer edge of an orthographic projection of a slope surface corresponding to the quantum dot unit in the slope surfaces of the support layer on the first base substrate. The inner edge is an edge of the orthographic projection of the slope surface proximate to a center of an opening enclosed by the slope surface. The outer edge is an edge of the orthographic projection of the slope surface away from the center of the opening enclosed by the slope surface.

In some embodiments, the support layer has a main surface away from the first base substrate and slope surfaces each for forming a respective opening of the support layer by enclosing. An orthographic projection of the black matrix on the first base substrate covers orthographic projections of the main surface and the slope surfaces of the support layer on the first base substrate.

In some embodiments, the black matrix is closer to the first base substrate than the support layer.

In some embodiments, a thickness of the support layer is in a range of 10 μm to 30 μm.

In some embodiments, a thickness of the black matrix is in a range of 1 μm to 2 μm.

In some embodiments, the cover plate further includes a color filter layer disposed between the quantum dot layer and the first base substrate. The color filter layer includes a plurality of filter units, and each filter unit is located in an opening region in the plurality of opening regions.

In some embodiments, in a case where the light-emitting device is configured to emit blue light under the drive of the driving circuit structure, the quantum dot layer includes red quantum dot units and green quantum dot units. The color filter layer includes red filter units, green filter units and blue filter units. A red quantum dot unit and a red filter unit are located in a same opening region in the plurality of opening regions. A green quantum dot unit and a green filter unit are located in another same opening region in the plurality of opening regions.

In some embodiments, in a case where the light-emitting device is configured to emit white light under the drive of the driving circuit structure, the quantum dot layer includes red quantum dot units, green quantum dot units and blue quantum dot units. The color filter layer includes red filter units, green filter units and blue filter units. A red quantum dot unit and a red filter unit are located in a same opening region in the plurality of opening regions. A green quantum dot unit and a green filter unit are located in another same opening region in the plurality of opening regions. A blue quantum dot unit and a blue filter unit are located in yet another same opening region in the plurality of opening regions.

In some embodiments, the display apparatus includes a plurality of pixel units arranged in an array. Each pixel unit includes a red sub-pixel, a blue sub-pixel and two green sub-pixels, and the sub-pixels included in each pixel unit are arranged in a row direction. In a column direction, red sub-pixels and blue sub-pixels are alternately arranged to form a red and blue sub-pixel column. In the column direction, green sub-pixels are arranged in sequence to form a green sub-pixel column. In the row direction, red and blue sub-pixel columns and green sub-pixel columns are alternately arranged.

In another aspect, a method for manufacturing a cover plate of a display apparatus is provided, which is used for manufacturing the cover plate of the display apparatus in any one of the above embodiments. The manufacturing method includes: providing the first base substrate; forming the black matrix and the support layer on the first base substrate, the black matrix and the support layer being stacked, the black matrix and the support layer each having the plurality of openings, and the plurality of openings of the black matrix being at least partially overlapped with the plurality of openings of the support layer, respectively, so as to form the plurality of opening regions; and forming the quantum dot layer on the first base substrate, the quantum dot layer including the plurality of quantum dot units, and each quantum dot unit being located in the opening region.

In some embodiments, forming the black matrix and the support layer on the first base substrate, includes: forming the support layer on the first base substrate, the support layer having a main surface away from the first base substrate and slope surfaces each for forming a respective opening of the support layer by enclosing; and forming the black matrix on a side of the support layer away from the first base substrate, the black matrix at least covering the main surface of the support layer.

In some embodiments, in a case where the slope surfaces of the support layer are non-covered by the black matrix, the method for manufacturing the cover plate of the display apparatus further includes: forming a light reflection layer on the side of the support layer away from the first base substrate between forming the support layer and forming the black matrix. The light reflection layer at least covers the slope surfaces of the support layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, but are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, orientations or positional relationships indicated by the terms such as "center," "upper," "lower," "front," "rear," "left," "right," "vertical," "horizontal," "top," "bottom," "inner", and "outer" are based on orientations or positional relationships shown in the drawings, which are merely to facilitate the description of the present disclosure and simplify the description, and are not to indicate or imply that the indicated devices or elements must have particular orientations, or must be constructed or operated in particular orientations, and thus cannot be construed as limitations on the present disclosure.

As shown in FIGS. 1, 2A, 2B and 2C, the embodiments of the present disclosure provide a display apparatus 100. The display apparatus 100 may be a display apparatus with a display function, such as a mobile phone or a tablet computer.

The display apparatus 100 includes a cover plate 1 and a display substrate 2, and the cover plate 1 and the display substrate 2 are arranged opposite to each other.

In some embodiments, the display apparatus 100 may be a self-luminous display apparatus. For example, the display apparatus 100 may be an organic light-emitting diode (OLED) display apparatus. In a case where the display apparatus 100 is the self-luminous display apparatus, the display substrate 2 is used for providing a light source. That is, the display substrate 2 emits light for display. The cover plate 1 of the display apparatus is provided on a light exit side of the display substrate 2. When the display apparatus 100 displays, light emitted from the display substrate 2 enters human eyes after passing through the cover plate 1 of the display apparatus, thereby displaying a screen.

Figure 1:
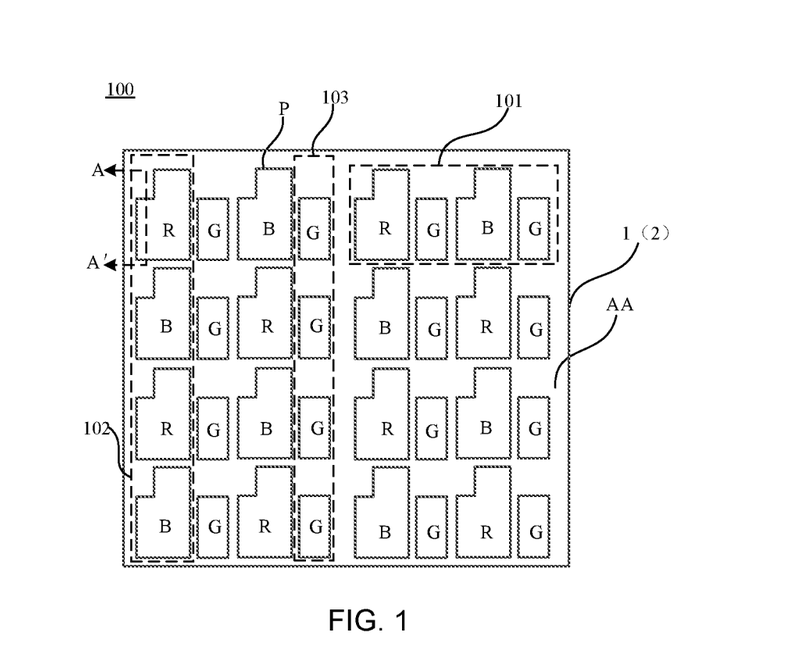
FIG. 1 is a top view of a display apparatus, in accordance with some embodiments of the present disclosure.

Referring to FIG. 1, the display apparatus 100 has a display area AA. A plurality of pixel units 101 arranged in an array are provided in the display area AA. Each pixel unit 101 includes a plurality of sub-pixels P of three different colors. For example, each pixel unit 101 includes a red sub-pixel (labeled R in FIG. 1), two green sub-pixels (labeled G in FIG. 1) and a blue sub-pixel (labeled B in FIG. 1). The sub-pixels P included in each pixel unit 101 are arranged in a row direction. In a column direction, red sub-pixels and blue sub-pixels are alternately arranged to form a red and blue sub-pixel column 102. In the column direction, green sub-pixels are arranged in sequence to form a green sub-pixel column 103. In the row direction, red and blue sub-pixel columns 102 and green sub-pixel columns 103 are alternately arranged.

Figure 2A:
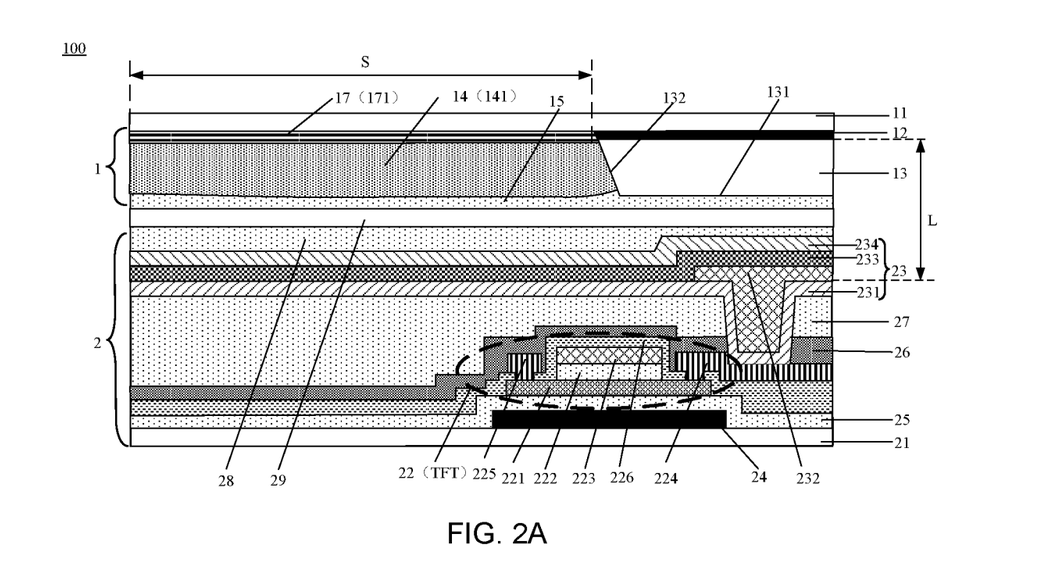
FIG. 2A is a sectional view of the display apparatus taken along the section line AA' in FIG. 1, in accordance with some embodiments of the present disclosure.
Figure 2B:
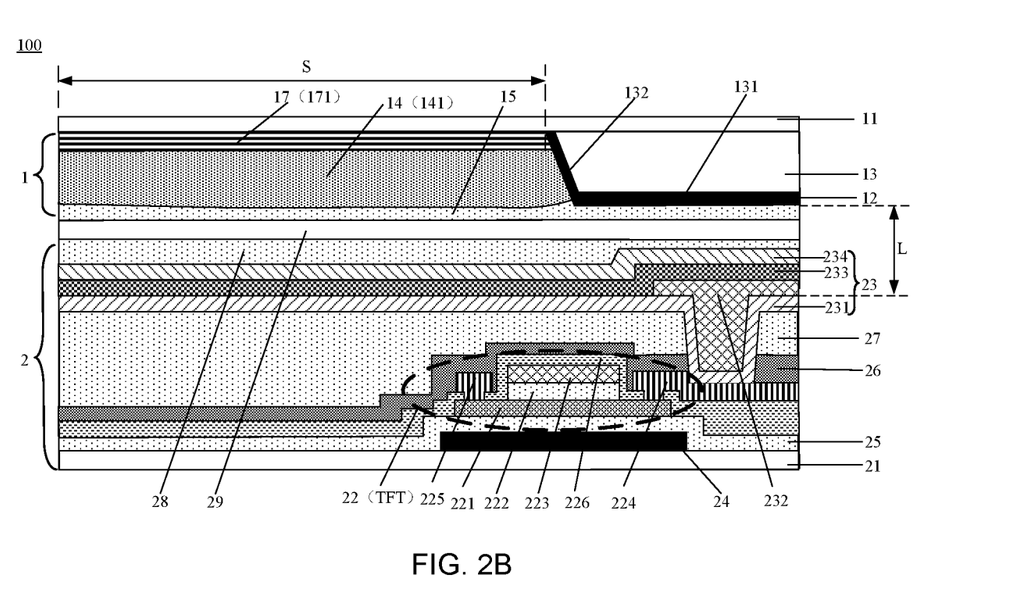
FIG. 2B is another sectional view of the display apparatus taken along the section line AA', in accordance with some embodiments of the present disclosure.
Figure 2C:
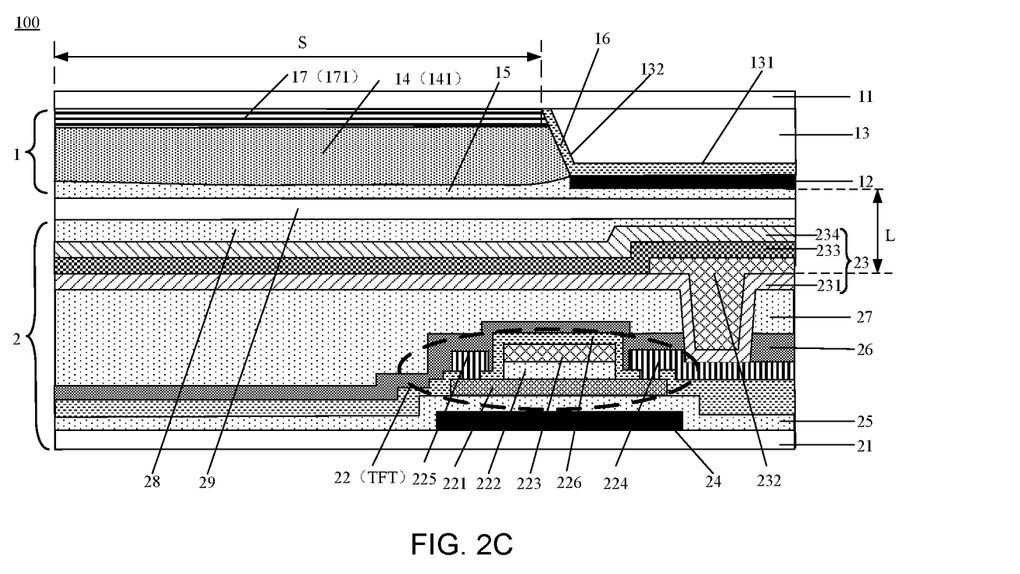
FIG. 2C is yet another sectional view of the display apparatus taken along the section line AA', in accordance with some embodiments of the present disclosure.

It will be understood that referring to FIGS. 2A, 2B and 2C, each sub-pixel P in the display apparatus 100 includes some structures located in the display substrate 2 and some structures located in the cover plate 1 of the display apparatus.

Referring to FIGS. 2A, 2B and 2C, the display substrate 2 includes a second base substrate 21. In each sub-pixel P, the structures located in the display substrate 2 include a driving circuit structure 22 disposed on a side of the second base substrate 21 proximate to the cover plate 1, and a light-emitting device 23 disposed on a side of the driving circuit structure 22 away from the second base substrate 21. The light-emitting device 23 is coupled to the driving circuit structure 22. The light-emitting device 23 emits light under a drive of the driving circuit structure 22.

Referring to FIGS. 2A, 2B and 2C again, the driving circuit structure 22 includes a plurality of thin film transistors (TFTs). For example, the TFT includes an active layer 221, a gate insulating layer 222, a gate 223, an interlayer insulating layer 226, a source 225 and a drain 224. The drain 224 and the source 225 are arranged in a same layer, and are electrically connected to the active layer 221.

It will be noted that the TFTs in the embodiments of the present disclosure may be bottom-gate thin film transistors or top-gate thin film transistors. In the drawings in the embodiments of the present disclosure, the TFT is a top-gate thin film transistor as an example for illustration.

Referring to FIGS. 2A, 2B and 2C again, the display substrate 2 may further include a light-shielding layer 24 and a buffer layer 25 that are disposed on a side of the TFTs proximate to the second base substrate 21. The light-shielding layer 24 is arranged farther from the TFTs than the buffer layer 25.

Referring to FIGS. 2A, 2B and 2C again, the display substrate 2 may further include a passivation layer 26 and a planarization layer 27 that are stacked between the driving circuit structures 22 and the light-emitting devices 23. The passivation layer 26 is arranged close to the driving circuit structures 22, and the planarization layer 27 is arranged close to the light-emitting devices 23.

For example, referring to FIGS. 2A, 2B and 2C again, the light-emitting device 23 includes an anode 231, a light-emitting functional layer 233 and a cathode 234 that are stacked in sequence.

The anode 231 is coupled to the drain 224 of the TFT.

The display substrate 2 further includes a pixel defining layer 232. The pixel defining layer 232 has a plurality of openings, and the openings of the pixel defining layer 232 are in one-to-one correspondence with opening regions of the sub-pixels P in the display apparatus 100.

In some embodiments, light-emitting functional layers 233 cover the pixel defining layer 232 and the plurality of openings of the pixel defining layer 232. It will be understood that referring to FIGS. 2A, 2B and 2C, portions of the light-emitting functional layers 233 respectively located in the plurality of openings of the pixel defining layer 232 are in contact with respective anodes 231, and portions of the light-emitting functional layers 233 covering the pixel defining layer 232 are not in contact with the anodes 231. In this way, when the light-emitting functional layers 233 realize the light-emitting function, the portions of the light-emitting functional layers 233 respectively located in the plurality of openings of the pixel defining layer 232 emit light, and the portions of the light-emitting functional layers 233 covering the pixel defining layer 232 do not emit light.

The cathode 234 is located on a side of the light-emitting functional layer 233 facing away from the second base substrate 21.

In some embodiments, the light-emitting functional layer 233 includes a light-emitting layer. Light emitted from the light-emitting layer is, for example, white light or blue light.

In some other embodiments, in addition to the light-emitting layer, the light-emitting functional layer 233 further includes one or more of an electron transporting layer (ETL), an electron injection layer (EIL), a hole transporting layer (HTL) and a hole injection layer (HIL).

Referring to FIGS. 2A, 2B and 2C again, the display substrate 2 further includes a second thin film encapsulation layer 28. The second thin film encapsulation layer 28 covers a side of the cathode layers 234 facing away from the second base substrate 21, and functions to encapsulate the light-emitting devices.

For example, the second thin film encapsulation layer 28 may be a high water blocking film layer, and may be used for preventing external water and oxygen from affecting the light-emitting devices 23. For example, the second thin film encapsulation layer 28 may be made of a material such as silicon nitride or silicon oxide.

Referring to FIGS. 2A, 2B and 2C again, the display apparatus 100 in the embodiments of the present disclosure further includes a filler 29 provided between the cover plate 1 of the display apparatus and the display substrate 2. The filler 29 fills a gap between the cover plate 1 of the display apparatus and the display substrate 2 after being assembled. On one hand, the filler 29 may function to support the cover plate 1 of the display apparatus. On another hand, the filler 29 may function to encapsulate the cover plate 1 of the display apparatus and the display substrate 2.

In some embodiments, the filler 29 may be a curable transparent liquid. The display apparatus 100 further includes a filler dam structure (the filler dam structure is not shown in the drawings of the present disclosure) disposed on a side of the second thin film encapsulation layer 28 in the display substrate 2 away from the second base substrate 21. The filler dam structure is in a ring shape around a periphery of the second thin film encapsulation layer 28, and the filler 29 is filled in a region surrounded by the filler dam structure.

It will be noted that the display apparatus 100 in the embodiments of the present disclosure may be a top-emitting display apparatus. In this case, the anodes 231 close to the second base substrate 21 are opaque, and the cathodes 234 away from the second base substrate 21 are transparent or translucent.

Figure 3:
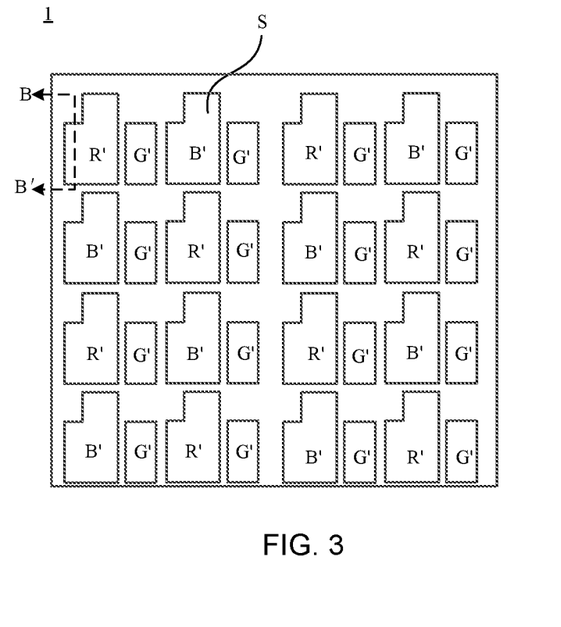
FIG. 3 is a structural diagram of a cover plate of a display apparatus, in accordance with some embodiments of the present disclosure.
Figure 4A:
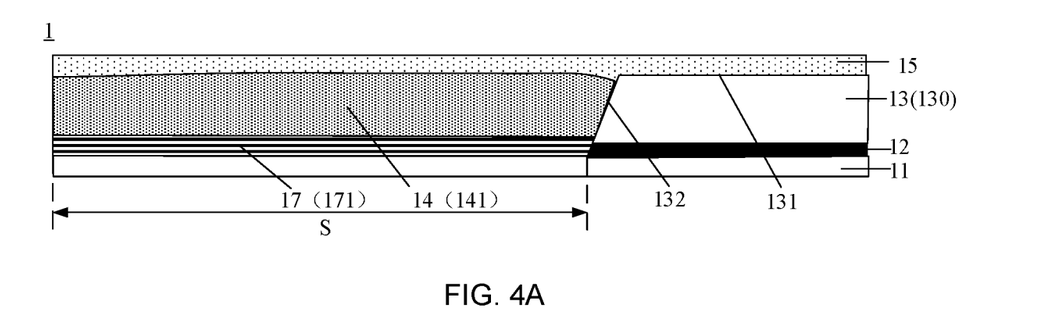
FIG. 4A is a sectional view of a cover plate of a display apparatus taken along the section line BB' in FIG. 3, in accordance with some embodiments of the present disclosure.
Figure 4B:
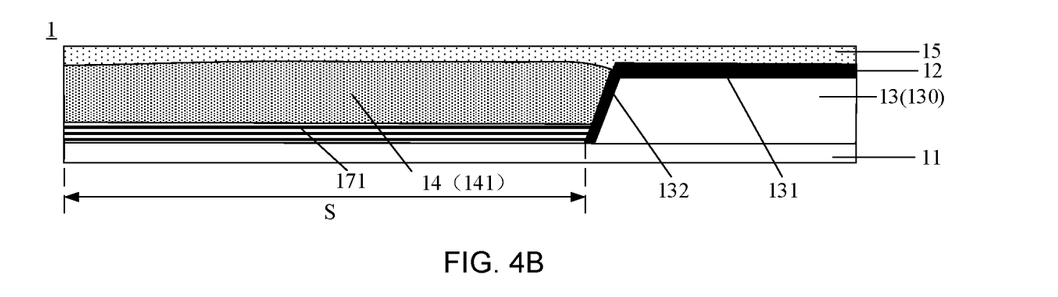
FIG. 4B is another sectional view of the cover plate of the display apparatus taken along the section line BB', in accordance with some embodiments of the present disclosure.

As shown in FIGS. 3, 4A and 4B, some embodiments of the present disclosure further provide the cover plate 1 of the display apparatus, which may be applied to the display apparatus 100. The cover plate 1 of the display apparatus has a plurality of opening regions S. The opening regions S are in one-to-one correspondence with the opening regions of the sub-pixels P in the display apparatus 100. It will be noted that in FIG. 3, opening regions S corresponding to red sub-pixels are labeled R', opening regions S corresponding to green sub-pixels are labeled G', and opening regions S corresponding to blue sub-pixels are labeled B'.

It can be known from the above structural description of the display substrate 2 in the display apparatus 100 that the openings of the pixel defining layer 232 in the display substrate 2 are in one-to-one correspondence with the opening regions of the sub-pixels P in the display apparatus 100. In this way, the opening regions S of the cover plate 1 of the display apparatus are in one-to-one correspondence with the openings of the pixel defining layer 232 in the display substrate 2. Based on this, when the display apparatus 100 realizes the display function, light emitted from the portions of the light-emitting functional layers 233 in the display substrate 2 respectively located in the openings of the pixel defining layer 232 enters human eyes after passing through respective opening regions S of the cover plate 1 of the display apparatus, thereby displaying a screen.

Figure 4C:
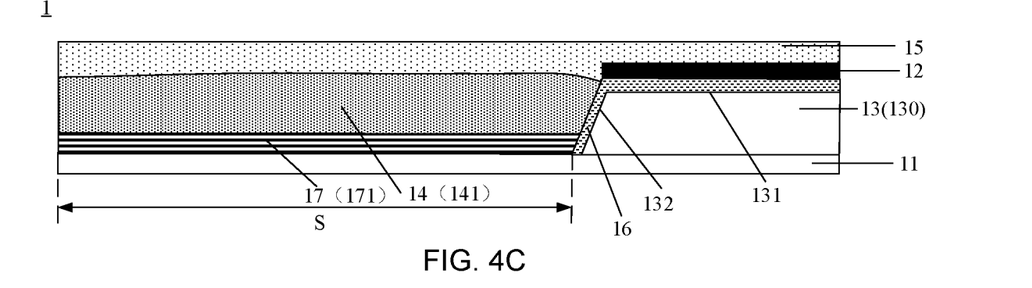
FIG. 4C is yet another sectional view of the cover plate of the display apparatus taken along the section line BB', in accordance with some embodiments of the present disclosure.

Referring to FIGS. 4A, 4B and 4C, the cover plate 1 of the display apparatus in the embodiments of the present disclosure includes a first base substrate 11, and a black matrix 12 and a support layer 13 that are stacked on a side of the first base substrate 11 proximate to the display substrate 2. The black matrix 12 and the support layer 13 each have a plurality of openings, and the plurality of openings of the black matrix 12 are at least partially overlapped (e.g., mostly overlapped, or substantially overlapped) with the plurality of openings of the support layer 13, respectively, so as to form the plurality of opening regions S.

It will be noted that in the embodiments of the present disclosure, in combination with FIGS. 1, 2A, 2B and 2C, the black matrix 12 is used for preventing lateral light emitted from the light-emitting functional layer 233 in the display substrate 2 from reaching adjacent sub-pixels P, so as to avoid color mixing in the display apparatus 100.

In the embodiments of the present disclosure, referring to FIGS. 2A, 2B and 2C, the support layer 13 has a specific height, and may be used as a spacer. After the display substrate 2 is assembled with the cover plate 1 of the display apparatus, the support layer 13 is used for supporting the cover plate 1 of the display apparatus.

Referring to FIGS. 4A, 4B and 4C, the cover plate 1 of the display apparatus in the embodiments of the present disclosure further includes a quantum dot layer 14 disposed on the first base substrate 11. The quantum dot layer 14 includes a plurality of quantum dot units 141, and each quantum dot unit 141 is located in an opening region S.

It will be noted that referring to FIGS. 4A, 4B and 4C, since the opening regions S are in one-to-one correspondence with the openings of the pixel defining layer 232 in the display substrate 2, the quantum dot units 141 located in respective opening regions S are also in one-to-one correspondence with the openings of the pixel defining layer 232. In this way, the light emitted from the portions of the light-emitting functional layers 233 in the display substrate 2 respectively located in the openings of the pixel defining layer 232 passes through the quantum dot units 141 in a process of passing through the opening regions S.

It will be understood that a quantum dot is a spherical semiconductor nanoparticle composed of Group II to Group VI or Group III to Group V elements, with a particle size generally between a few nanometers and tens of nanometers. Due to the quantum confinement effect, an originally continuous energy band of a quantum dot material is changed into a discrete energy level structure, so that the quantum dot material may emit visible light after being excited by external light. A frequency of the emitted visible light varies with the particle size of the quantum dots. Therefore, a color of the light emitted from the quantum dots may be controlled by adjusting the particle size of the quantum dots. In the embodiments of the present disclosure, each quantum dot unit 141 may emit light of a corresponding color when excited by the light emitted from the light-emitting functional layers 233 in the display substrate 2.

It can be known from the above description that the light emitted from the light-emitting functional layers 233 may be white light or blue light.

Figure 5:
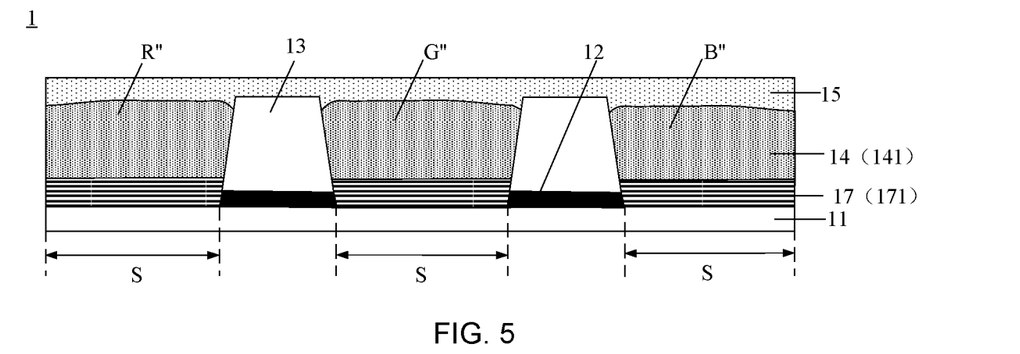
FIG. 5 is a structural diagram of a cover plate of another display apparatus, in accordance with some embodiments of the present disclosure.

In some embodiments, as shown in FIG. 5, in a case where the light (also referred to as excitation light) emitted from the light-emitting functional layers 233 is white light, the plurality of quantum dot units 141 include a plurality of red quantum dot units (labeled R" in FIG. 5), a plurality of green quantum dot units (labeled G" in FIG. 5), and a plurality of blue quantum dot units (labeled B" in FIG. 5). The red quantum dot unit may absorb the excitation light irradiated onto the red quantum dot unit and emit red light. The green quantum dot unit may absorb the excitation light irradiated onto the green quantum dot unit and emit green light. The blue quantum dot unit may absorb the excitation light irradiated onto the blue quantum dot unit and emit blue light.

Figure 6:
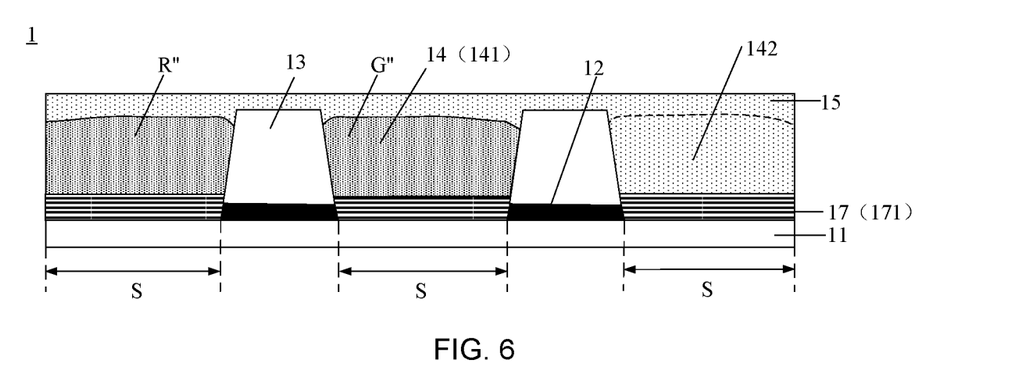
FIG. 6 is a structural diagram of a cover plate of yet another display apparatus, in accordance with some embodiments of the present disclosure.

In some embodiments, as shown in FIG. 6, in a case where the light emitted from the light-emitting functional layers 233 is blue light, the plurality of quantum dot units 141 include a plurality of red quantum dot units (labeled R" in FIG. 6) and a plurality of green quantum dot units (labeled G" in FIG. 6). The quantum dot layer 14 further includes a plurality of light transmitting units 142. The light transmitting unit 142 is used for transmitting blue light. It will be noted here that the light transmitting unit 142 directly faces an opening region S in which no quantum dot unit 141 is provided in the plurality of opening regions S formed by the black matrix 12 and the support layer 13. It will be understood that a material of the light transmitting unit 142 may be a material of a first thin film encapsulation layer 15 to be formed subsequently. That is, the light transmitting units 142 may be synchronously formed in a step of forming the first thin film encapsulation layer 15 to save process steps. In this way, the red quantum dot unit may absorb the excitation light irradiated onto the red quantum dot unit and emit red light. The green quantum dot unit may absorb the excitation light irradiated onto the green quantum dot unit and emit green light. The light transmitting unit may directly transmit blue light. Thus, a quantum dot unit that emits blue light is not required to be provided, which simplifies the process and saves materials.

The quantum dot unit may not completely absorb the excitation light irradiated onto the quantum dot unit due to an influence of properties of the quantum dot material. In the related art, by increasing the thickness of a quantum dot unit, the quantum dot unit may absorb excitation light as much as possible, so as to improve a luminous efficiency of the quantum dot unit. In the related art, a black matrix serves as a dam structure to isolate quantum dot units, so as to ensure that color mixing of the quantum dot units of different colors does not occur. The thickness of the black matrix cannot reach a level of 2 μm or more due to an influence of a material and a manufacturing process of the black matrix, so that the thickness of the quantum dot units cannot reach a level of 2 μm or more. Therefore, the quantum dot units are isolated by only relying on the black matrix as the dam structure, so that the quantum dot units are difficult to thicken, and the thickness of the quantum dot units is limited.

In the cover plate 1 of the display apparatus in the embodiments of the present disclosure, each quantum dot unit 141 is located in the opening region S formed by the black matrix 12 and the support layer 13, and the black matrix 12 and the support layer 13 constitute a dam structure for each quantum dot unit 141. The support layer 13 may be made of a material that is able to be made thick. In this way, since the support layer 13 may be made thick, the dam structure formed by the black matrix 12 and the support layer 13 may also be made thick, and thus the thickness of the quantum dot units 141 may be made thick. Therefore, in the cover plate 1 of the display apparatus in the embodiments of the present disclosure, the quantum dot unit 141 may made thick, so that the quantum dot unit 141 may absorb the excitation light as much as possible, so as to improve a luminous efficiency of the quantum dot unit, thereby improving a luminous efficiency of the display apparatus 100.

It will be noted that in the embodiments of the present disclosure, the support layer 13 may be made of the material that is able to be made thick. For example, the support layer 13 is made of a photoresist, and the thickness of the support layer 13 made of the photoresist may reach a level of 10 μm or more. For example, the photoresist includes acrylate.

For example, the thickness of the support layer 13 is in a range of 10 μm to 30 μm. For example, the thickness of the support layer 13 is 10 μm, 15 μm, 20 μm or 25 μm.

For example, the thickness of the black matrix 12 is in a range of 1 μm to 2 μm. For example, the thickness of the black matrix 12 is 1.1 μm, 1.5 μm or 1.7 μm.

For example, in a case where the thickness of the support layer 13 is 10 μm, and the thickness of the black matrix 12 is 1 μm, the thickness of the dam structure formed by the black matrix 12 and the support layer 13 may reach 11 μm. In this way, the thickness of the quantum dot units 141 respectively located in the opening regions S may also be made to 11 μm. Compared with the case that the thickness of the quantum dot units cannot reach the level of 2 μm or more in the related art, the thickness of the quantum dot units 141 in the embodiments of the present disclosure is increased by at least 9 μm.

In addition, in the cover plate 1 of the display apparatus in the embodiments of the present disclosure, the quantum dot unit 141 may be made thick, so that the quantum dot unit 141 may absorb the excitation light as much as possible, so as to improve the luminous efficiency of the quantum dot unit. As shown in FIG. 6, in a case where the light emitted from the light-emitting functional layers 233 is blue light (i.e., the excitation light), the plurality of quantum dot units 141 include the plurality of red quantum dot units (labeled R" in FIG. 6) and the plurality of green quantum dot units (labeled G" in FIG. 6), and part of the blue light is directly displayed without being processed by the quantum dot units, the green quantum dot unit and the red quantum dot unit may be made thick, so that both the green quantum dot unit and the red quantum dot unit absorb the excitation light as much as possible, so as to improve a conversion efficiency of the green quantum dot unit and the red quantum dot unit to blue light. Thus, a red light brightness and a green light brightness of the display apparatus 100 are improved, so as to reduce a brightness difference between red light and blue light and a brightness difference between green light and blue light, thereby improving a brightness uniformity of the entire display apparatus 100.

A material of the black matrix 12 is not limited in the embodiments of the present disclosure, and the material may be selected based on a function of preventing a light leakage of pixels. For example, the black matrix 12 may be made of a metal material, such as chromium, aluminum, silver, or an aluminum-silver alloy.

It will be noted that as shown in FIGS. 4A, 4B and 4C, the cover plate 1 of the display apparatus in the embodiments of the present disclosure further includes the first thin film encapsulation layer 15 for encapsulating the quantum dot layer 14. The first thin film encapsulation layer 15 is provided on a side of the support layer 13 and the quantum dot layer 14 away from the first base substrate 11. As shown in FIGS. 2A, 2B and 2C, after the display substrate 2 is assembled with the cover plate 1 of the display apparatus to form the display apparatus 100, the first thin film encapsulation layer 15 and the second thin film encapsulation layer 28 are arranged opposite to each other, and the filler 29 mentioned in the foregoing is provided between the first thin film encapsulation layer 15 and the second thin film encapsulation layer 28. The first thin film encapsulation layer 15, the second thin film encapsulation layer 28, and the filler 29 disposed therebetween constitute an encapsulation structure, which functions to encapsulate the display apparatus 100.

In addition, it can be known from the above description that the display apparatus 100 may be the top-emitting display apparatus. Referring to FIGS. 2A, 2B and 2C, the light emitted from the light-emitting functional layers 233 in the display substrate 2 is irradiated onto the quantum dot layer 14 sequentially through the cathodes 234, the second thin film encapsulation layer 28 and the first thin film encapsulation layer 15. Each quantum dot unit 141 in the quantum dot layer 14 absorbs the light irradiated onto the quantum dot unit 141, and emits light of a corresponding color, thereby realizing color display.

The black matrix 12 prevents light of each sub-pixel from reaching adjacent sub-pixels as much as possible, so as to avoid the color mixing in the display apparatus 100 as much as possible. However, since the film layers located between the black matrix 12 and the anodes 231 (opaque) are made of transparent materials, the light of each sub-pixel easily passes through the film layers located between the black matrix 12 and the anodes 231 (opaque) and reaches adjacent sub-pixels, resulting in the color mixing in the display apparatus 100.

It will be understood that the greater a distance L between the black matrix 12 and the anode 231 (opaque) is, the easier it is for the light of each sub-pixel to pass through the film layers located between the black matrix 12 and the anode 231 (opaque) and reach adjacent sub-pixels. The smaller the distance L between the black matrix 12 and the anode 231 (opaque) is, the more difficult it is for the light of each sub-pixel to pass through the film layers located between the black matrix 12 and the anode 231 (opaque) and reach adjacent sub-pixels.

Referring to FIGS. 2A, 2B and 2C again, the distance L between the black matrix 12 and the anode 231 refers to a distance between a side surface of the black matrix 12 away from the first base substrate 11 and a side surface of the anode 231 away from the second base substrate 21 in a direction perpendicular to the first base substrate 11. That is, the distance L between the black matrix 12 and the anode 231 is equal to a sum of the thicknesses of the film layers located between the black matrix 12 and the anode 231.

In the embodiments of the present disclosure, the black matrix 12 may be farther from the first base substrate 11 than the support layer 13. Alternatively, the black matrix 12 may be closer to the first base substrate 11 than the support layer 13. For example, in some embodiments, as shown in FIG. 4A, the black matrix 12 is closer to the first base substrate 11 than the support layer 13. In some other embodiments, as shown in FIGS. 4B and 4C, the black matrix 12 is farther from the first base substrate 11 than the support layer 13.

As shown in FIG. 2A, in a case where the black matrix 12 is closer to the first base substrate 11 than the support layer 13, the film layers located between the black matrix 12 and the anode 231 include the support layer 13, the first thin film encapsulation layer 15, the second thin film encapsulation layer 28, the cathode 234, the light-emitting functional layer 233 and the pixel defining layer 232. The distance L between the black matrix 12 and the anode 231 is equal to a sum of the thicknesses of the support layer 13, the first thin film encapsulation layer 15, the second thin film encapsulation layer 28, the cathode 234, the light-emitting functional layer 233 and the pixel defining layer 232.

It will be noted that the thickness of the pixel defining layer 232 here refers to the thickness of a portion of the pixel defining layer 232 other than a portion of the pixel defining layer 232 located within via holes (i.e., via holes for contacting the drains 224 of respective TFTs) in the planarization layer 27 and the passivation layer 26.

As shown in FIGS. 2B and 2C, in a case where the black matrix 12 is farther from the first base substrate 11 than the support layer 13, the film layers located between the black matrix 12 and the anode 231 include the first thin film encapsulation layer 15, the second thin film encapsulation layer 28, the cathode 234, the light-emitting functional layer 233 and the pixel defining layer 232. The distance L between the black matrix 12 and the anode 231 is equal to a sum of the thicknesses of the first thin film encapsulation layer 15, the second thin film encapsulation layer 28, the cathode 234, the light-emitting functional layer 233 and the pixel defining layer 232.

It can be seen that in this case, even if the support layer 13 is provided in the cover plate 1 of the display apparatus in the embodiments of the present disclosure, the distance L between the black matrix 12 and the anode 231 is not increased. In this way, when the cover plate 1 of the display apparatus in the embodiments of the present disclosure is applied to the display apparatus 100, the luminous efficiency of the display apparatus 100 is able to be improved, and the light-shielding effect and the color mixing prevention effect of the black matrix 12 are not affected.

It will be understood that as shown in FIGS. 4A, 4B and 4C, the support layer 13 has a main surface 131 away from the first base substrate 11 and slope surfaces 132 each for forming a respective opening of the support layer 13 by enclosing.

Figure 7:
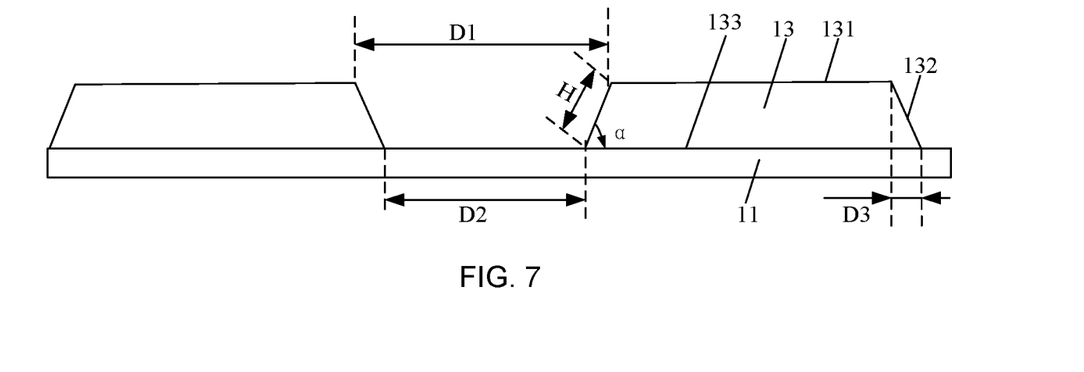
FIG. 7 is a structural diagram of a support layer, in accordance with some embodiments of the present disclosure.

For example, as shown in FIGS. 4A, 4B and 4C, a portion 130 of the support layer 13 located between two adjacent openings has a frustum of a pyramid structure (only a portion of the frustum of the pyramid structure is shown in FIG. 2A, 2B, 2C, 4A, 4B or 4C). As shown in FIG. 7, a section of the support layer 13 in a thickness direction of the support layer 13 includes trapezoids. Intersection lines of the main surface 131 of the support layer 13 and the section respectively form bottom edges of the trapezoids away from the first base substrate 11, and intersection lines of each slope surface 132 of the support layer 13 and the section form side edges of a respective trapezoid in the trapezoids.

In some embodiments, as shown in FIGS. 4A, 4B and 4C, the portion 130 of the support layer 13 located between two adjacent openings has a frustum of a square pyramid structure.

Here, "the portion 130 of the support layer 13 located between two adjacent openings has the frustum of the square pyramid structure" means that as shown in FIGS. 5 to 7, the section of the support layer 13 in the thickness direction of the support layer 13 includes regular trapezoids, and in two edges of the regular trapezoid parallel to the first base substrate 11, a side length of an edge away from the first base substrate 11 is less than a side length of another edge proximate to the first base substrate 11.

It will be noted that in a case where the portion 130 of the support layer 13 located between two adjacent openings has the frustum of the square pyramid structure, as shown in FIG. 7, since an included angle α between the slope surface 132 and a bottom surface 133 (i.e., a surface of the support layer 13 proximate to the first base substrate 11) of the support layer 13 is an acute angle, for each opening of the support layer 13 enclosed by the slope surface 132, a width D1 of the opening at a position away from the first base substrate 11 is greater than a width D2 of the opening at a position close to the first base substrate 11. In this way, an influence of the support layer 13 on a subsequent process of forming the quantum dot layer 14 by using an inkjet printing process is reduced.

It will be noted that the inkjet printing process refers to pre-fabricating a dam structure on a substrate, and then dropping ink droplets into a region defined by the dam structure. For example, in the embodiments of the present disclosure, forming the quantum dot layer 14 by using the inkjet printing process refers to dropping the quantum dot material into the opening regions S.

In some embodiments, referring to FIG. 2A, in the case where the black matrix 12 is closer to the first base substrate 11 than the support layer 13, the black matrix 12 coincides with the bottom surface (i.e., the surface of the support layer 13 proximate to the first base substrate 11) of the support layer 13.

In some embodiments, referring to FIGS. 2B and 2C, in the case where the black matrix 12 is farther from the first base substrate 11 than the support layer 13, the black matrix 12 at least covers the main surface 131 of the support layer 13. In this case, in order to prevent lateral light emitted from the light-emitting device 23 in each sub-pixel from passing through the support layer 13 and reaching adjacent sub-pixels, it is necessary to shield the slope surface 132 of the support layer 13 from light.

For example, referring to FIG. 4B, the black matrix 12 may be used to shield the slope surface 132 of the support layer 13 from light. That is, the black matrix 12 not only covers the main surface 131 of the support layer 13, but also covers the slope surface 132 of the support layer 13. As shown in FIG. 2B, this may prevent the lateral light emitted from the light-emitting device 23 in each sub-pixel from passing through the support layer 13 and reaching adjacent sub-pixels, thereby avoiding the color mixing in the display apparatus 100.

For example, referring to FIG. 4C, the slope surface 132 of the support layer 13 may be shielded from light by covering the slope surface 132 of the support layer 13 with a light reflection layer 16. For example, the cover plate 1 of the display apparatus in the embodiments of the present disclosure further includes the light reflection layer 16 disposed between the black matrix 12 and the support layer 13. The light reflection layer 16 at least covers the slope surface 132 of the support layer 13 (e.g., covers most or all of the slope surface 132). In this way, a portion of the light reflection layer 16 covering the slope surface 132 of the support layer 13 may reflect the lateral light emitted from the light-emitting device 23 in each sub-pixel back to the opening region of the sub-pixel. Therefore, on one hand, the light reflection layer 16 may limit the light emitted from each pixel in this sub-pixel to prevent the light from reaching adjacent sub-pixels, thereby avoiding the color mixing in the display apparatus 100. On another hand, the light reflection layer 16 may improve a light extraction efficiency of each pixel to improve a light utilization rate.

It will be noted that in the embodiments of the present disclosure, as shown in FIG. 7, due to a large thickness of the support layer 13, a slope (i.e., the included angle α between the slope surface 132 and the bottom surface 133) of the slope surface 132 after exposure and development is small, and a slope length H is long, so that a width D3 of the slope surface 132 is large. For example, the width D3 of the slope surface 132 may be up to 5.5 μm.

Figure 8:
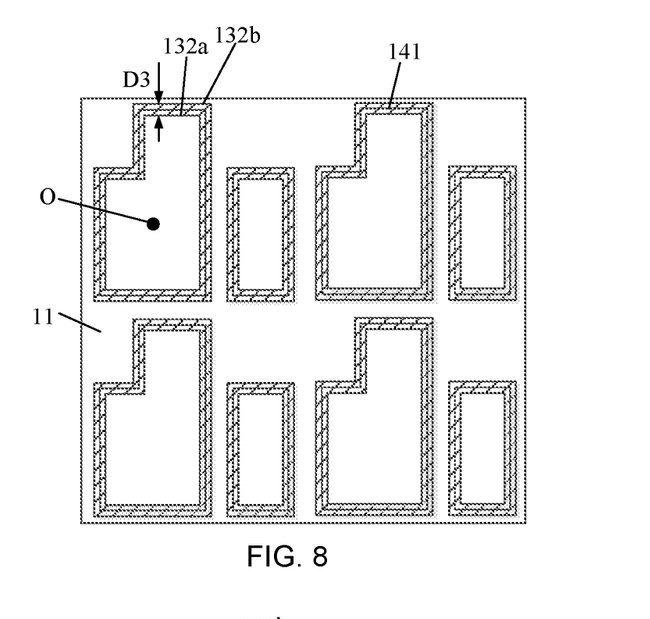
FIG. 8 is a structural diagram of a cover plate of yet another display apparatus, in accordance with some embodiments of the present disclosure.

Here, the width D3 of the slope surface 132 refers to, as shown in FIG. 8, a distance between an inner edge 132a and an outer edge 132b of an orthographic projection of the slope surface 132 on the first base substrate 11. The inner edge 132a is an edge of the orthographic projection of the slope surface 132 proximate to a center O of an opening enclosed by the slope surface 132. The outer edge 132b is an edge of the orthographic projection of the slope surface 132 away from the center O of the opening enclosed by the slope surface 132.

It will be understood that in a case where the slope surface 132 of the support layer 13 is covered with the light reflection layer 16, as shown in FIG. 8, the light reflection layer 16 may reflect light irradiated onto the slope surface 132 back to the sub-pixel for reuse, which is equivalent to increasing the opening region of the sub-pixel by a portion (i.e., the shaded portion in FIG. 8). The increased portion corresponds to a portion between the inner edge 132a and the outer edge 132b of the support layer 13. Equivalently, an edge of the opening region in the sub-pixel widens outward D3.

In the embodiments of the present disclosure, an edge of an orthogonal projection of an opening of the black matrix 12 on the first base substrate 11 coincides or substantially coincides with one of an inner edge 132a and an outer edge 132b of an orthographic projection of a slope surface 132, opposite to the opening of the black matrix 12, of the support layer 13 on the first base substrate 11. As shown in FIG. 2A, the edge of the orthogonal projection of the opening of the black matrix 12 coincides or substantially coincides with the inner edge 132a of the orthographic projection of the slope surface 132. As shown in FIG. 2C, the edge of the orthogonal projection of the opening of the black matrix 12 coincides or substantially coincides with the outer edge 132b of the orthographic projection of the slope surface 132.

In the embodiments of the present disclosure, a material of the light reflection layer 16 includes a metal material. For example, the light reflection layer 16 is made of a metal material such as silver, molybdenum, aluminum or nickel.

In the embodiments of the present disclosure, the light reflection layer 16 may be of a single-layer structure or a stacked-layer structure. In a case where the light reflection layer 16 is of a single-layer structure, which may be, for example, a single layer of silver, a single layer of molybdenum, a single layer of aluminum, or a single layer of nickel. In a case where the light reflection layer 16 is of a stacked-layer structure, which may be, for example, a stacked-layer structure formed by stacking an indium tin oxide layer, a silver layer and an indium tin oxide layer sequentially, or a stacked-layer structure formed by stacking at least two metal layers, such as a stacked-layer structure formed by stacking a molybdenum layer, an aluminum layer and a nickel layer sequentially.

In some embodiments, the thickness of the light reflection layer 16 is in a range of 100 nm to 300 nm. For example, the thickness of the light reflection layer 16 is 100 nm, 200 nm or 300 nm.

Figure 9:
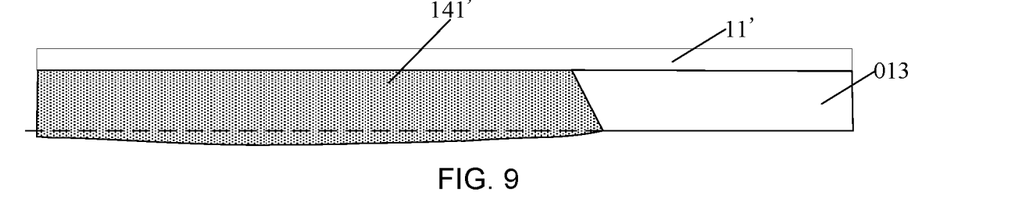
FIG. 9 is a structural diagram of a cover plate of a display apparatus, in accordance with the related art.

In the related art, as shown in FIG. 9, a quantum dot unit 141' is formed by an inkjet printing process, and in an actual printing process, an appearance of the quantum dot unit 141' after film formation is mostly thick in the middle and thin at two sides due to an influence of a dam structure 013. That is, the quantum dot unit 141' is thinner at a position close to the dam structure 013, and is thicker at a position away from the dam structure 013. If an edge of an orthographic projection of the quantum dot unit 141' on a first base substrate 11' coincides with an outer edge of an orthographic projection of a slope surface of the dam structure 013 on the first base substrate 11', a surface of the quantum dot unit 141' away from the first base substrate 11' protrudes from a surface of the dam structure 013 away from the first base substrate 11', which is unfavorable for an encapsulation of the quantum dot unit 141'.

Therefore, referring to FIG. 8, in some embodiments, an edge of an orthographic projection of a quantum dot unit 141 on the first base substrate 11 is located between an inner edge 132a and an outer edge 132b of an orthographic projection of a slope surface 132 corresponding to the quantum dot unit 141 of the support layer 13 on the first base substrate 11. That is, the orthographic projection of the slope surface 132 of the support layer 13 on the first base substrate 11 at least partially coincides with the orthographic projection of the quantum dot unit 141 on the first base substrate 11. In this way, the quantum dot unit 141 may be ensured to be limited within the opening of the support layer 13. That is, a surface of the quantum dot unit 141 away from the first base substrate 11 does not protrude or substantially does not protrude from a surface of the support layer 13 away from the first base substrate 11, which is favorable for a subsequent encapsulation of the quantum dot unit 141.

In some embodiments, as shown in FIGS. 4A, 4B and 4C, the cover plate 1 of the display apparatus in the embodiments of the present disclosure further includes a color filter layer 17 disposed between the quantum dot units 141 and the first base substrate 11. The color filter layer 17 includes a plurality of filter units 171, and each filter unit 171 is located in an opening region S.

The filter unit 171 and the quantum dot unit 141 in the opening region S correspond to a same color. For example, as shown in FIG. 6, in some embodiments, in a case where the plurality of filter units 171 include a plurality of red filter units, a plurality of green filter units and a plurality of blue filter units, and the plurality of quantum dot units 141 include the plurality of red quantum dot units and the plurality of green quantum dot units, a red filter unit and a red quantum dot unit are located in an opening region S, and a green filter unit and a green quantum dot unit are located in an opening region S.

It can be understood that since the quantum dot unit cannot completely absorb the excitation light irradiated onto the quantum dot unit, part of the light emitted from the light-emitting functional layers 233 in the display substrate 2 still shows its original color after passing through the quantum dot units. The filter units 171 may filter the part of the light to avoid the color mixing in the display apparatus 100.

As shown in FIGS. 10 to 13, some embodiments of the present disclosure further provide a method for manufacturing a cover plate of a display apparatus for manufacturing the cover plate 1 of the display apparatus in any one of the above embodiments. The manufacturing method includes S1 to S3.

Figure 10:
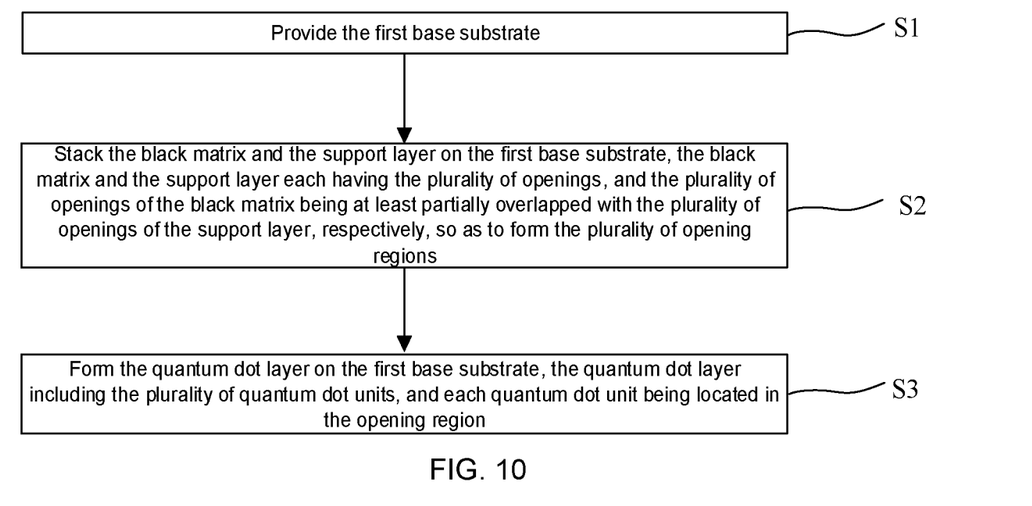
FIG. 10 is a flow diagram of a method for manufacturing a cover plate of a display apparatus, in accordance with some embodiments of the present disclosure.

In S1, the first base substrate 11 is provided.

In S2, the black matrix 12 and the support layer 13 are formed on the first base substrate 11.

The black matrix 12 and the support layer 13 are stacked. The black matrix 12 and the support layer 13 each have the plurality of openings, and the plurality of openings of the black matrix 12 are at least partially overlapped with the plurality of openings of the support layer 13, respectively, so as to form the plurality of opening regions S.

For example, forming the black matrix 12 includes following steps. A solution of a black matrix material may be used to form a black matrix material layer on the first base substrate by using a process such as spin coating or blade coating. Next, the black matrix material layer is baked to remove a solvent in the black matrix material layer. Then, the baked black matrix material layer is exposed and developed sequentially, and the black matrix material layer is patterned to form the plurality of openings, so as to obtain the black matrix 12. Finally, the black matrix is cured by baking.

For example, forming the support layer 13 includes following steps. A photoresist may be formed on the first base substrate by using a process such as spin coating or blade coating, and a solvent in the photoresist is removed to obtain a photoresist film layer. Then, the photoresist film layer is sequentially exposed and developed, and the photoresist film layer is patterned to form the plurality of openings, so as to obtain the support layer 13.

In S2, the order of forming the black matrix 12 and the support layer 13 is not limited.

Figure 11:
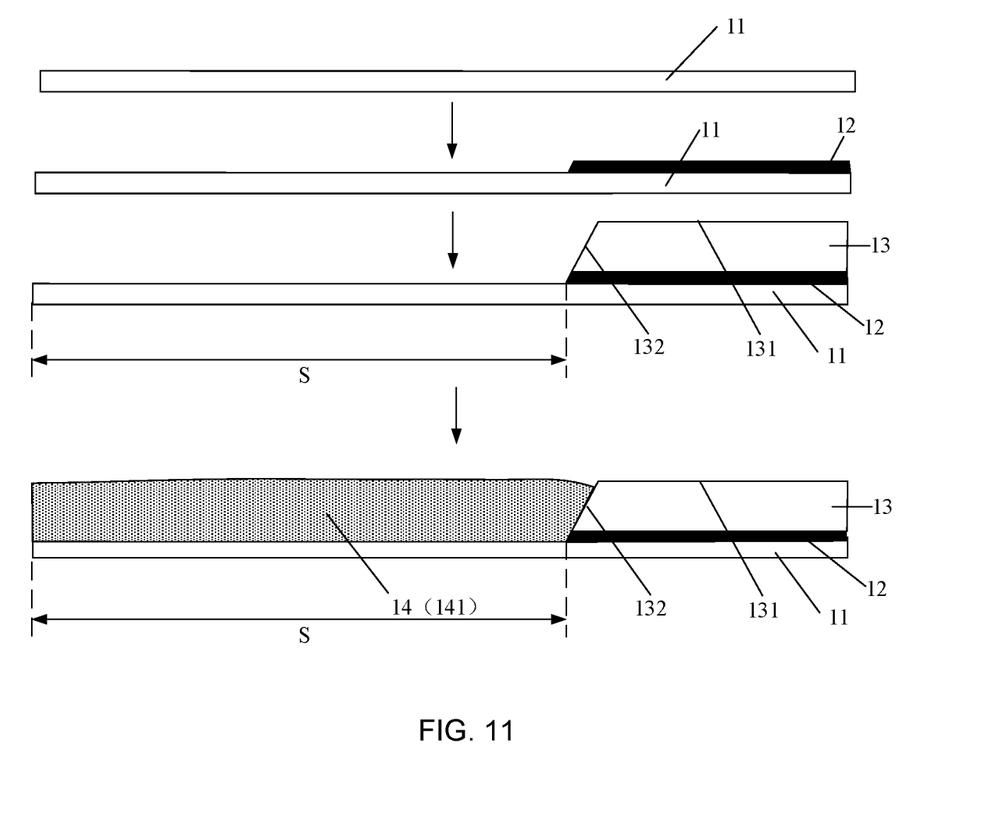
FIG. 11 is a diagram showing manufacturing steps of a cover plate of a display apparatus, in accordance with some embodiments of the present disclosure.

For example, as shown in FIG. 11, the black matrix 12 is formed first, and then the support layer 13 is formed. In this case, shapes and structures of the black matrix 12 and the support layer 13 may refer to the above related descriptions of the embodiments corresponding to FIGS. 2A and 4A, and will not be repeated here.

Figure 12:
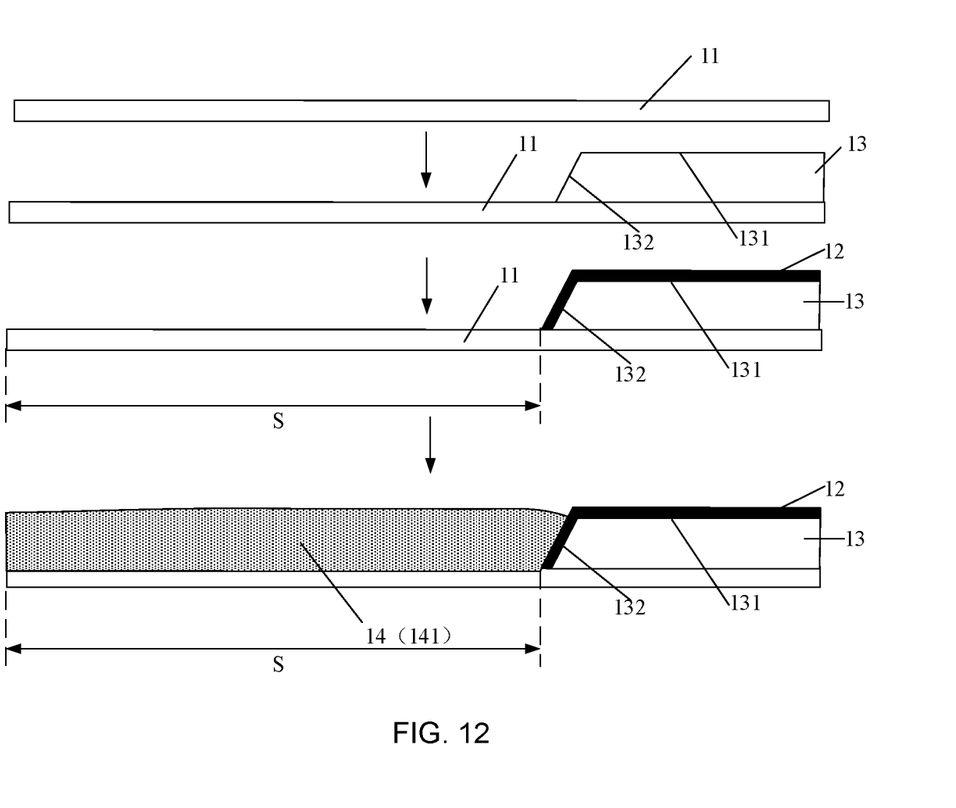
FIG. 12 is a diagram showing manufacturing steps of a cover plate of another display apparatus, in accordance with some embodiments of the present disclosure.
Figure 13:
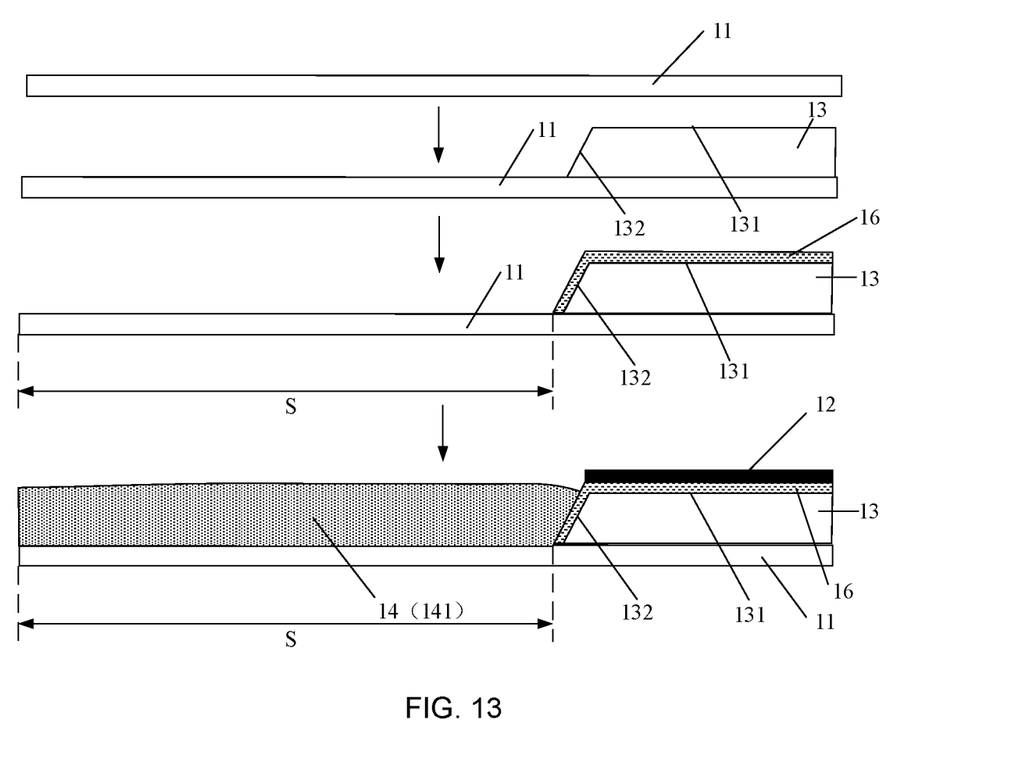
FIG. 13 is a diagram showing manufacturing steps of a cover plate of yet another display apparatus, in accordance with some embodiments of the present disclosure.

For example, as shown in FIGS. 12 and 13, the support layer 13 is formed first, and then the black matrix 12 is formed.

In this case, for example, as shown in FIG. 12, forming the black matrix 12 and the support layer 13 on the first base substrate 11 in S2 includes following steps.

The support layer 13 is formed on the first base substrate 11. The support layer 13 has a main surface 131 away from the first base substrate 11 and slope surfaces 132 each for forming a respective opening of the support layer 13 by enclosing.

The black matrix 12 is formed on a side of the support layer 13 away from the first base substrate 11. The black matrix 12 at least covers the main surface 131 of the support layer 13. For example, the black matrix 12 covers the main surface 131 and the slope surfaces 132 of the support layer 13.

For another example, as shown in FIG. 13, forming the black matrix 12 and the support layer 13 on the first base substrate 11 in S2 includes following steps.

The support layer 13 is formed on the first base substrate 11. The support layer 13 has a main surface 131 away from the first base substrate 11 and slope surfaces 132 each for forming a respective opening of the support layer 13 by enclosing.

The light reflection layer 16 is formed on a side of the support layer 13 away from the first base substrate 11. The light reflection layer 16 at least covers the slope surfaces 132 of the support layer 13. For example, the light reflection layer 16 covers the main surface 131 and the slope surfaces 132 of the support layer.

The black matrix is formed on a side of the support layer 13 away from the first base substrate 11. The black matrix 12 covers the main surface 131 of the support layer 13.

In S3, the quantum dot layer 14 is formed on the first base substrate 11. The quantum dot layer 14 includes the plurality of quantum dot units 141, and each quantum dot unit 141 is located in an opening region S.

For example, the quantum dot material may be printed in the opening regions S by using an inkjet printing process, and the quantum dot material is cured to obtain the quantum dot units 141.

A shape and a structure of the quantum dot layer 14 may refer to the above related descriptions, and will not be repeated here.

In addition, in some embodiments, the method for manufacturing the cover plate of the display apparatus further includes a step of forming a color filter layer. The step of forming the color filter layer may be performed, for example, before a step of forming the black matrix 12 and the support layer 13. A shape and a structure of the color filter layer may refer to the above related descriptions, and will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display apparatus, comprising:
a cover plate and a display substrate arranged opposite to the cover plate; wherein the cover plate includes:
a first base substrate;
a black matrix and a support layer that are stacked on a side of the first base substrate proximate to the display substrate, the black matrix and the support layer each having a plurality of openings, and the plurality of openings of the black matrix being at least partially overlapped with the plurality of openings of the support layer, respectively, so as to form a plurality of opening regions; wherein a section of the support layer in a thickness direction of the support layer includes regular trapezoids, and in two edges of each regular trapezoid parallel to the first base substrate, a side length of an edge away from the first base substrate is less than a side length of another edge proximate to the first base substrate;
a quantum dot layer disposed on the side of the first base substrate proximate to the display substrate, the quantum dot layer including a plurality of quantum dot units, and each quantum dot unit being located in an opening region in the plurality of opening regions; and
a color filter layer disposed between the quantum dot layer and the first base substrate, the color filter layer including a plurality of filter units, and each filter unit being located in the opening region in the plurality of opening regions; and
the display substrate includes:
a second base substrate;
driving circuit structures disposed on a side of the second base substrate proximate to the cover plate; and
light-emitting devices disposed on a side of the driving circuit structures away from the second base substrate, each light-emitting device being coupled to a driving circuit structure in the driving circuit structures, and the light-emitting device being configured to emit light under a drive of the driving circuit structure.

2. The display apparatus according to claim 1, wherein the black matrix is farther from the first base substrate than the support layer.

3. The display apparatus according to claim 1, wherein the support layer has a main surface away from the first base substrate and slope surfaces each for forming a respective opening of the support layer by enclosing; and
the cover plate further includes:
a light reflection layer at least covering the slope surfaces of the support layer.

4. The display apparatus according to claim 3, wherein an edge of an orthogonal projection of an opening of the black matrix on the first base substrate coincides with one of an inner edge and an outer edge of an orthographic projection of a slope surface, opposite to the opening of the black matrix, of the support layer on the first base substrate; wherein the inner edge is an edge of the orthographic projection of the slope surface proximate to a center of an opening enclosed by the slope surface; the outer edge is an edge of the orthographic projection of the slope surface away from the center of the opening enclosed by the slope surface.

5. The display apparatus according to claim 3, wherein a material of the light reflection layer includes a metal material.

6. The display apparatus according to claim 3, wherein the light reflection layer is of a stacked-layer structure formed by stacking a transparent metal oxide layer, a light reflection metal layer and another transparent metal oxide layer sequentially, or a stacked-layer structure formed by stacking at least two metal layers.

7. The display apparatus according to claim 6, wherein the stacked-layer structure formed by stacking the transparent metal oxide layer, the light reflection metal layer and the another transparent metal oxide layer sequentially is a stacked-layer structure formed by stacking an indium tin oxide layer, a silver layer and another indium tin oxide layer sequentially; or
the stacked-layer structure formed by stacking the at least two metal layers is a stacked-layer structure formed by stacking a molybdenum layer, an aluminum layer and a nickel layer sequentially.

8. The display apparatus according to claim 3, wherein a thickness of the light reflection layer is in a range of 100 nm to 300 nm.

9. The display apparatus according to claim 3, wherein an edge of an orthographic projection of the quantum dot unit on the first base substrate is located between an inner edge and an outer edge of an orthographic projection of a slope surface corresponding to the quantum dot unit in the slope surfaces of the support layer on the first base substrate; wherein the inner edge is an edge of the orthographic projection of the slope surface proximate to a center of an opening enclosed by the slope surface; the outer edge is an edge of the orthographic projection of the slope surface away from the center of the opening enclosed by the slope surface.

10. The display apparatus according to claim 2, wherein the support layer has a main surface away from the first base substrate and slope surfaces each for forming a respective opening of the support layer by enclosing; and
an orthographic projection of the black matrix on the first base substrate covers orthographic projections of the main surface and the slope surfaces of the support layer on the first base substrate.

11. The display apparatus according to claim 1, wherein the black matrix is closer to the first base substrate than the support layer.

12. The display apparatus according to claim 1, wherein a thickness of the support layer is in a range of 10 µm to 30 µm.

13. The display apparatus according to claim 1, wherein a thickness of the black matrix is in a range of 1 µm to 2 µm.

14. The display apparatus according to claim 1, wherein the light-emitting device is configured to emit blue light under the drive of the driving circuit structure;
the quantum dot layer includes red quantum dot units and green quantum dot units; and
the color filter layer includes red filter units, green filter units and blue filter units; wherein
a red quantum dot unit and a red filter unit are located in a same opening region in the plurality of opening regions; and a green quantum dot unit and a green filter unit are located in another same opening region in the plurality of opening regions.

15. The display apparatus according to claim 1, wherein the light-emitting device is configured to emit white light under the drive of the driving circuit structure;
the quantum dot layer includes red quantum dot units, green quantum dot units and blue quantum dot units; and
the color filter layer includes red filter units, green filter units and blue filter units; wherein
a red quantum dot unit and a red filter unit are located in a same opening region in the plurality of opening regions; a green quantum dot unit and a green filter unit are located in another same opening region in the plurality of opening regions; and a blue quantum dot unit and a blue filter unit are located in yet another same opening region in the plurality of opening regions.

16. The display apparatus according to claim 1, wherein the display apparatus comprises:
a plurality of pixel units arranged in an array, each pixel unit including a red sub-pixel, a blue sub-pixel and two green sub-pixels, and the sub-pixels included in each pixel unit being arranged in a row direction; wherein
in a column direction, red sub-pixels and blue sub-pixels are alternately arranged to form a red and blue sub-pixel column; in the column direction, green sub-pixels are arranged in sequence to form a green sub-pixel column; and
in the row direction, red and blue sub-pixel columns and green sub-pixel columns are alternately arranged.

17. A method for manufacturing the cover plate of the display apparatus according to claim 1, comprising:
providing the first base substrate;
forming the black matrix and the support layer on the first base substrate; the black matrix and the support layer being stacked, the black matrix and the support layer each having the plurality of openings, and the plurality of openings of the black matrix being at least partially overlapped with the plurality of openings of the support layer, respectively, so as to form the plurality of opening regions; wherein the section of the support layer in the thickness direction of the support layer includes the regular trapezoids, and in the two edges of the regular trapezoid parallel to the first base substrate, the side length of the edge away from the first base substrate is less than the side length of another edge proximate to the first base substrate; and
forming the quantum dot layer on the first base substrate; the quantum dot layer including the plurality of quantum dot units, and each quantum dot unit being located in the opening region;
the method further comprising:
forming the color filter layer on the first base substrate, the color filter layer being disposed between the quantum dot layer and the first base substrate, the color filter layer including the plurality of filter units, and each filter unit being located in the opening region in the plurality of opening regions.

18. The method for manufacturing the cover plate of the display apparatus according to claim 17, wherein forming the black matrix and the support layer on the first base substrate, includes:
forming the support layer on the first base substrate; the support layer having a main surface away from the first base substrate and slope surfaces each for forming a respective opening of the support layer by enclosing; and
forming the black matrix on a side of the support layer away from the first base substrate; the black matrix at least covering the main surface of the support layer.

19. The method for manufacturing the cover plate of the display apparatus according to claim 18, wherein the slope surfaces of the support layer are non-covered by the black matrix, and the manufacturing method further comprises:
forming a light reflection layer on the side of the support layer away from the first base substrate between forming the support layer and forming the black matrix; the light reflection layer at least covering the slope surfaces of the support layer.

* * * * *